United States Patent
Sun et al.

(10) Patent No.: US 11,437,392 B2
(45) Date of Patent: Sep. 6, 2022

(54) COMPACT MEMORY CELL WITH A SHARED CONDUCTIVE SELECT GATE AND METHODS OF MAKING SUCH A MEMORY CELL

(71) Applicant: GLOBALFOUNDRIES Singapore Pte. Ltd., Singapore (SG)

(72) Inventors: Yongshun Sun, Singapore (SG); Eng Huat Toh, Singapore (SG); Shyue Seng Tan, Singapore (SG); Kiok Boone Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 30 days.

(21) Appl. No.: 16/940,586

(22) Filed: Jul. 28, 2020

(65) Prior Publication Data
US 2022/0037349 A1 Feb. 3, 2022

(51) Int. Cl.
*H01L 27/11568* (2017.01)
*H01L 29/792* (2006.01)

(52) U.S. Cl.
CPC ...... *H01L 27/11568* (2013.01); *H01L 29/792* (2013.01)

(58) Field of Classification Search
CPC ........... H01L 27/1052; H01L 27/10844; H01L 27/11; H01L 27/112; H01L 27/115; H01L 21/8239; H01L 27/1025; H01L 27/1023; H01L 27/108
See application file for complete search history.

(56) References Cited

U.S. PATENT DOCUMENTS

| | | | |
|---|---|---|---|
| 6,630,383 B1 | 10/2003 | Ibok et al. | |
| 2007/0215929 A1 | 9/2007 | Yasuda | |
| 2008/0237696 A1 | 10/2008 | Wang | |
| 2009/0016113 A1 | 1/2009 | Chen et al. | |
| 2009/0140317 A1 | 6/2009 | Rosmeulen | |
| 2010/0173485 A1 | 7/2010 | Lee et al. | |
| 2015/0187787 A1* | 7/2015 | Shum | H01L 21/768 257/365 |

(Continued)

FOREIGN PATENT DOCUMENTS

| | | |
|---|---|---|
| CN | 114005873 A | 2/2022 |
| CN | 114005874 A | 2/2022 |

OTHER PUBLICATIONS

Chiang et al., "High-Program/Erase-Speed SONOS With In Situ Silicon Nanocrystals," IEEE Electron Device Letters, 29:1148-51, Oct. 2008.

(Continued)

*Primary Examiner* — Mohammad M Choudhry
(74) *Attorney, Agent, or Firm* — Yee Tze Lim; Hoffman Warnick LLC

(57) ABSTRACT

An illustrative device disclosed herein includes a first memory cell comprising a first memory gate positioned above an upper surface of a semiconductor substrate and a second memory cell comprising a second memory gate positioned above the upper surface of the semiconductor substrate. In this example, the device also includes a conductive select gate structure positioned above the upper surface of the semiconductor substrate between the first and second memory gates, wherein the conductive select gate structure is shared by the first and second memory cells.

20 Claims, 15 Drawing Sheets

(56) References Cited

U.S. PATENT DOCUMENTS

2017/0062446 A1     3/2017   Kodama et al.
2020/0350325 A1    11/2020   Zhang et al.

OTHER PUBLICATIONS

Chiang et al., "Characteristics of SONOS-Type Flash Memory With In Situ Embedded Silicon Nanocrystals," IEEE Transactions on Electron Devices, 57:1895-902, Aug. 2010.
Chin et al., "Improved Device Characteristics in Charge-Trapping-Engineered Flash Memory Using High-k Dielectrics".
Chin et al., "Low Voltage High Speed SiO2/AlGaN/AlLaO3/TaN Memory with Good Retention," IEEE, 2005.
Choi et al., "High Density Silicon Nanocrystal Embedded in SiN Prepared by Low Energy (<500eV) SiH4 Plasma Immersion Ion Implantation for Non-volatile Memory Applications," IEEE, 2005.
Liao et al., "A New Charge-Trap-Engineered Memory Device with Silicon-Oxide-Nitride-Vacuum-Silicon (SONVAS) Structure for LTPS-TFT-Based Applications," IEEE, 2010.
Liu et al., "Effect of Gate Overlap and Source/Drain Doping Gradient on 10-nm CMOS Performance," IEEE Transactions on Electron Devices, 53:3146-49, Dec. 2006.
Lu et al., "p-Type SiGe Transistors with Low Gate Leakage Using SiN Gate Dielectric," IEEE Electron Device Letters, 20:514-16, Oct. 1999.
Lue et al., "BE-SONOS: A Bandgap Engineered SONOS with Excellent Performance and Reliability," IEEE, 2005.
Ohba et al., "10 nm Bulk-Planar SONOS-type Memory with Double Tunnel Junction and Sub-10 nm Scaling Utilizing Source to Drain Direct Tunnel Sub-threshold," IEEE, 2008.
Sung et al., "Multi-Layer SONOS with Direct Tunnel Oxide for High Speed and Long Retention Time".
Floadia Corporation brochure entitled "LEE Flash G2, Flash beyond Flash," 2017-2020.
Floadia Corporation brochure entitled "Technology—The Beauty of SONOS," 2017-2020.
U.S. Appl. No. 16/940,522, Notice of Allowance dated Jan. 14, 2022, 5 pages.
U.S. Appl. No. 16/940,522, Non-Final Office Action dated May 7, 2021, 14 pages.
U.S. Appl. No. 16/940,522, Final Office Action dated Jul. 19, 2021, 10 pages.
U.S. Appl. No. 16/940,522, Non-Final Office Action dated Oct. 18, 2021, 8 pages.

* cited by examiner

| | | SL (V) | MG0 (V) | SG (V) | MG1 (V) | BL (V) |
|---|---|---|---|---|---|---|
| PGM | Cell0 Sel. | 4~5 | 10~12 | Von | 3~4 | 0 |
| | Cell1 Sel. | 0 | 3~4 | Von | 10~12 | 4~5 |
| | Unsel. | 4~5 | 0 | 0 | 0 | 4~5 |
| ERS | Sel. | 0 | -10 | 0 | -10 | 0 |
| | Unsel. | 0 | 0 | 0 | 0 | 0 |
| Read | Cell0 Sel. | 0 Or 1~1.5 | 0 | 3~4 | Von | 1~1.5 or 0 |
| | Cell1 Sel. | 0 | Von | 3~4 | 0 | 1~1.5 |
| | Unsel. | 0 | 0 | 0 | 0 | 0 or 1~1.5 |

Fig. 10

COMPACT MEMORY CELL WITH A SHARED CONDUCTIVE SELECT GATE AND METHODS OF MAKING SUCH A MEMORY CELL

BACKGROUND OF THE INVENTION

Field of the Invention

The present disclosure generally relates to the fabrication of integrated circuits, and, more particularly, to various embodiments of a novel compact memory cell with a shared conductive select gate and various novel methods of making such a memory cell.

Description of the Related Art

Non-volatile memory cells are in widespread use in many modern integrated circuit devices and in many consumer products. In general, memory cells are the means by which electrical information is stored. There are a variety of different forms of memory cells, e.g., floating-gate type memory cells, charge-trapping type memory cells, etc. One typical configuration of a charge-trapping memory cell includes a gate insulation layer positioned on a semiconductor substrate, a charge storage layer positioned on the gate insulation layer, a blocking insulation layer positioned on the charge storage layer and a gate electrode positioned above the blocking insulation layer. Millions of such memory cells are typically included in even the most basic electronic consumer product.

The various structures of the memory cell may be made of a variety of different materials. In one of the more common material combinations, the gate insulation layer and the blocking insulation layer are made of silicon dioxide and the charge storage layer is made of silicon nitride (or a silicon rich nitride). Such a memory cell is sometimes referred to as an "ONO" type memory cell because of the materials employed (Oxide-Nitride-Oxide) in the memory cell. The gate electrode may be comprised of a variety of different conductive materials, e.g., polysilicon, a metal, a metal compound, etc. In the case where the gate insulation layer and the blocking insulation layer are made of silicon dioxide, the charge storage layer is made of silicon nitride, and the gate electrode is made of polysilicon, such a memory cell is generally known as a SONOS (Silicon-Oxide-Nitride-Oxide-Silicon) type memory cell. Another variation of such charge-trapping type memory cell is known as a MONOS (Metal-Oxide-Nitride-Oxide-Silicon) cell, wherein the gate electrode comprises a metal, the gate insulation layer and the blocking insulation layer are made of silicon dioxide and the charge storage layer is made of silicon nitride. In yet another variation, the blocking insulation layer may be made of a high-insulation material (k value greater than 10) and the gate electrode is made of polysilicon. Such a memory cell is sometimes referred to as a SHINOS (Silicon-HI-k-Nitride-Oxide-Silicon) memory cell. There are many more possible material configurations as well.

Irrespective of the exact structure and materials of such memory cells, there is a constant drive in the industry to increase the performance and durability of such memory cells and to reduce the physical size and increase the packing density of such memory cells on an integrated circuit device. The present disclosure is directed to various embodiments of a novel compact memory cell with a shared conductive select gate and various novel methods of making such a memory cell.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of a novel compact memory cell with a shared conductive select gate and various novel methods of making such a memory cell. One illustrative device disclosed herein includes a first memory cell comprising a first memory gate positioned above an upper surface of a semiconductor substrate and a second memory cell comprising a second memory gate positioned above the upper surface of the semiconductor substrate. In this example, the device also includes a conductive select gate structure positioned above the upper surface of the semiconductor substrate between the first and second memory gates, wherein the conductive select gate structure is shared by the first and second memory cells.

BRIEF DESCRIPTION OF THE DRAWINGS

The disclosure may be understood by reference to the following description taken in conjunction with the accompanying drawings, in which like reference numerals identify like elements, and in which:

FIGS. 1-15 depict various embodiments of a novel compact memory cell with a shared conductive select gate and various novel methods of making such a memory cell. The drawings are not to scale.

Figure 1:
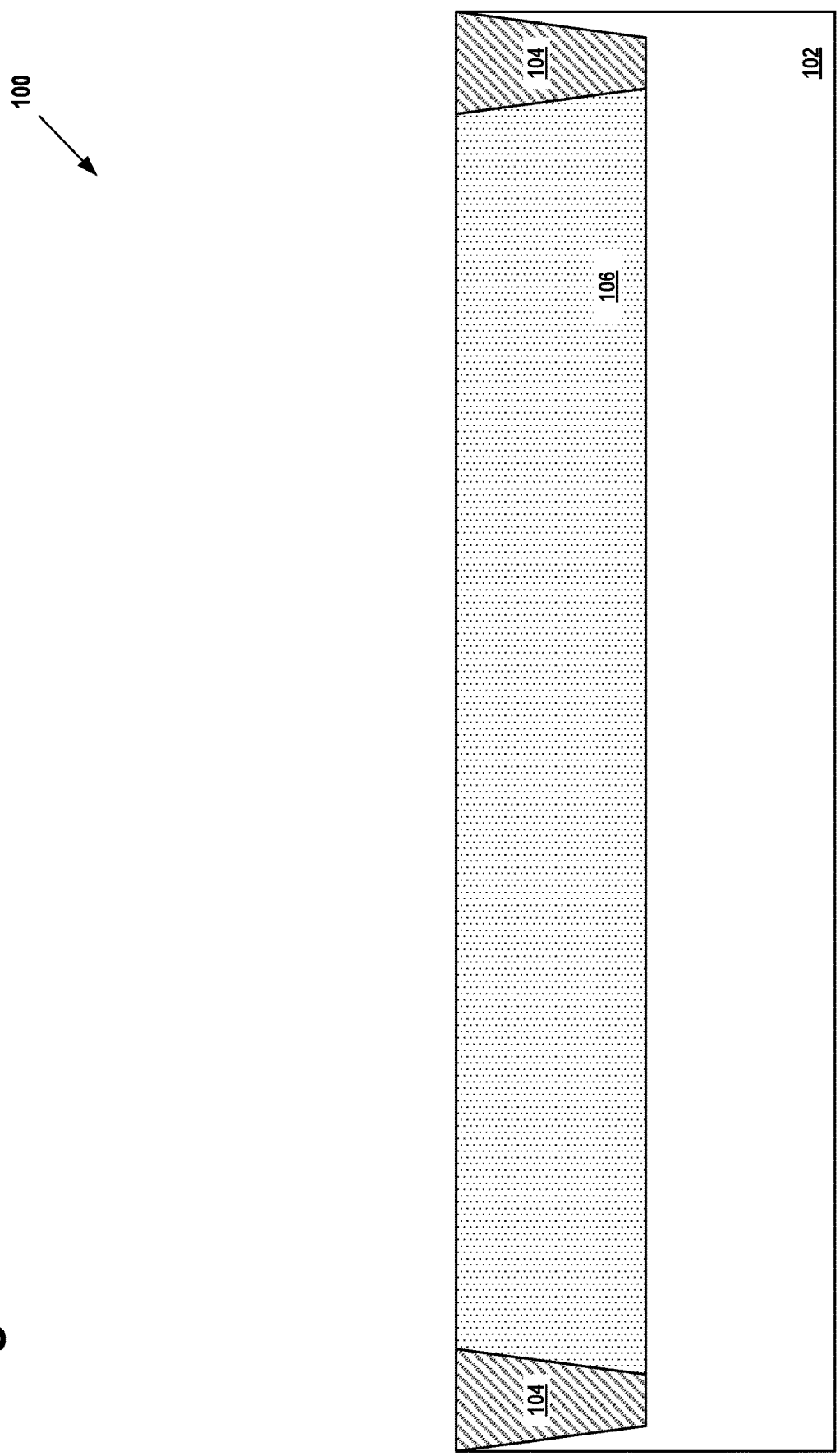

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. As will be appreciated by those skilled in the art after a complete reading of the present application, various doped regions, e.g., source/drain regions, halo implant regions, well regions and the like, are not depicted in the attached drawings. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the various embodiments of the IC product 100 disclosed herein may be incorporated into any type of integrated circuit product, e.g., it may be a stand-alone memory product, a product where memory circuits are embedded with logic circuits, etc. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 1-15 depict various embodiments of an IC product 100 that includes a novel and compact arrangement of memory cells 101A, 101B (collectively referenced using the numeral 101) with a shared conductive select gate and various novel methods of making such memory cells 101. The memory cells 101 may be either an N-type device or a P-type device. In the illustrative example depicted herein, the memory cells 101 will be N-type devices.

The memory cells 101 will be formed on and above a semiconductor substrate 102. The semiconductor substrate 102 may have a variety of configurations, such as a bulk silicon configuration. The substrate 102 may also have a semiconductor-on-insulator (SOI) configuration that includes a base semiconductor layer, a buried insulation layer and an active semiconductor layer positioned above the buried insulation layer, wherein transistor devices (not shown) that are formed on the substrate 102 are formed in and above the active semiconductor layer. The substrate 102 may be made of silicon or it may be made of semiconductor materials other than silicon. Thus, the terms "substrate" or "semiconductor substrate" should be understood to cover all semiconductor materials and all forms of such semiconductor materials.

FIG. 1 depicts the IC product 100 at an early stage of fabrication after several processing operations were performed. First, an isolation structure 104 was formed in the substrate 102 by performing known manufacturing techniques. The isolation structure 104 may be comprised of a variety of materials, e.g., silicon dioxide. Thereafter, a P-well region 106 was formed in the substrate 102. The P-well region 106 may be formed by performing a known ion implantation process through a patterned implantation mask (not shown), e.g., a patterned layer of photoresist. The P-well region 106 may be formed using a P-type dopant, such as boron or boron difluoride. The parameters of the ion implantation process that is performed to form the P-well region 106, as well as the concentration of dopant atoms in the P-well region 106, may vary depending upon the application. In the examples in the drawings, the various doped regions will be simplistically depicted as having a generally rectangular shaped cross-sectional configuration in their as-implanted position, i.e., the approximate position of the implanted dopant atoms immediately after the conclusion of the implantation process. After a complete reading of the present application, those skilled in the art will appreciate that the dopant atoms in the P-well region 106 will tend to migrate from their as-implanted position due to various processing operations that are performed to complete the manufacture of the IC product 100 after the formation of the P-well region 106.

Figure 2:
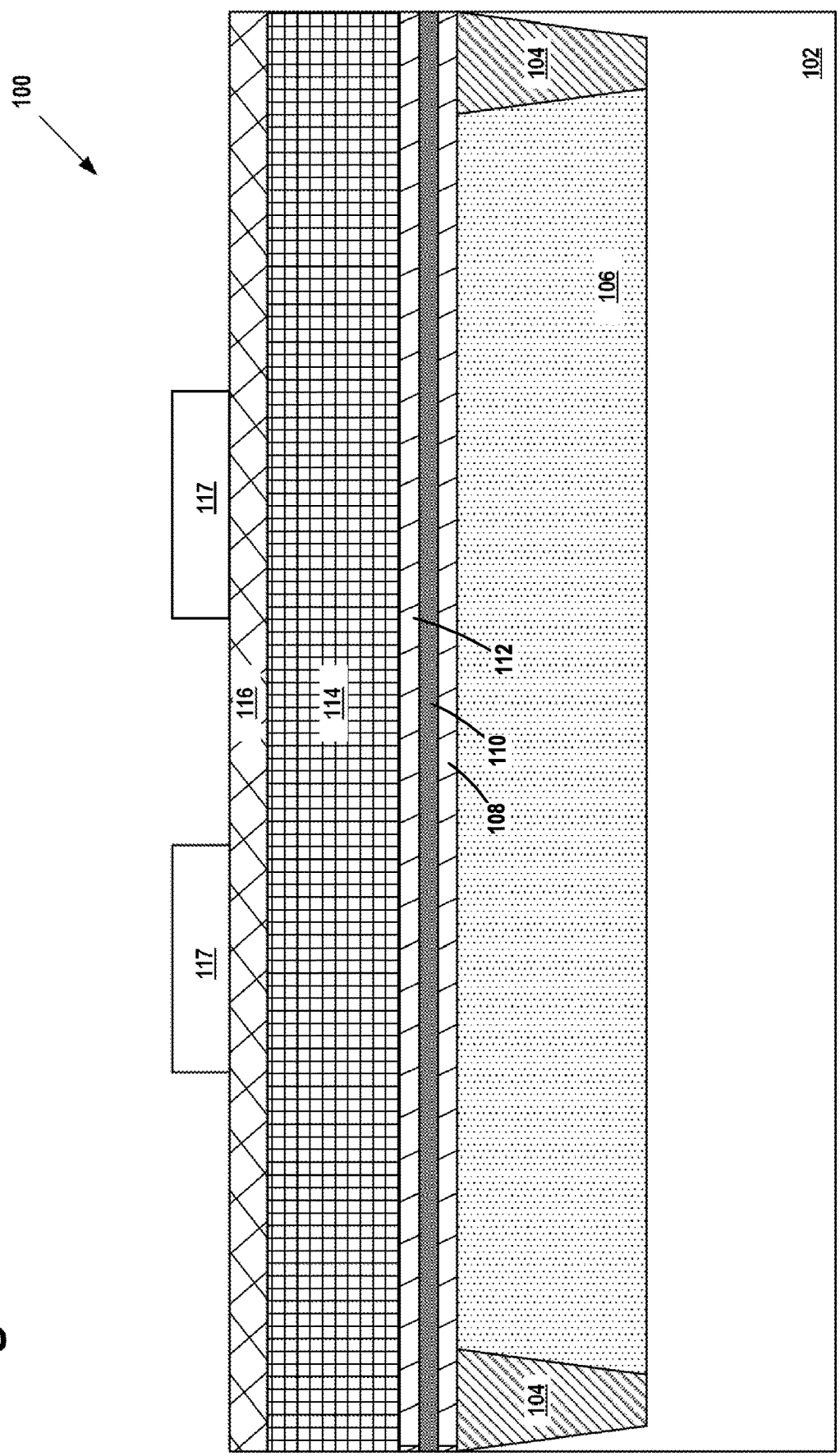

FIG. 2 depicts the IC product 100 after several process operations were performed. First, various layers of material for the memory cells 101 were sequentially formed above the substrate 102. More specifically, a gate insulation layer 108, a charge storage layer 110, a blocking insulation layer 112, a layer of gate electrode material 114 and a layer of capping material 116 were formed above the substrate 102. Also depicted in FIG. 2 is a patterned etch mask 117 that was formed above the layer of capping material 116. In one illustrative example, the patterned etch mask 117 may be a patterned layer of photoresist or OPL. In other applications, the patterned etch mask 117 may be a patterned hard mask. The patterned etch mask 117 may be formed by performing known manufacturing techniques.

The layers of material shown in FIG. 2 may be made of a variety of different materials and they may be formed to a variety of different thicknesses depending upon the particular application. For example, the gate insulation layer 108 may be comprised of a material such as silicon dioxide, $Al_2O_3$, hafnium oxide, a high-k insulating material (k value of 10 or greater), etc. The charge storage layer 110 may be comprised of a material such as silicon nitride, $HfO_2$, $HfO_x$, HfAlO, etc. The blocking insulation layer 112 may be comprised of a material such as silicon dioxide, a high-k insulating material (k value of 10 or greater) $HfO_x$, etc. The layer of gate electrode material 114 may be comprised of any conductive material such as polysilicon, amorphous polysilicon, etc. The capping material 116 may be comprised of a material such as silicon nitride, an oxide material, etc. In one particular example, the gate insulation layer 108 may be made of silicon dioxide, the charge storage layer 110 may be made of silicon nitride, the blocking insulation layer 112 may be made of silicon dioxide, the gate electrode material 114 may be polysilicon and the capping material 116 may be silicon nitride. In some applications, the gate insulation layer 108 may be thinner than the blocking insulation layer 112, but that may not be the case in all applications, e.g., the gate insulation layer 108 may have a thickness of about 2 nm, while the blocking insulation layer 112 may have a thickness of about 5 nm.

Figure 3:
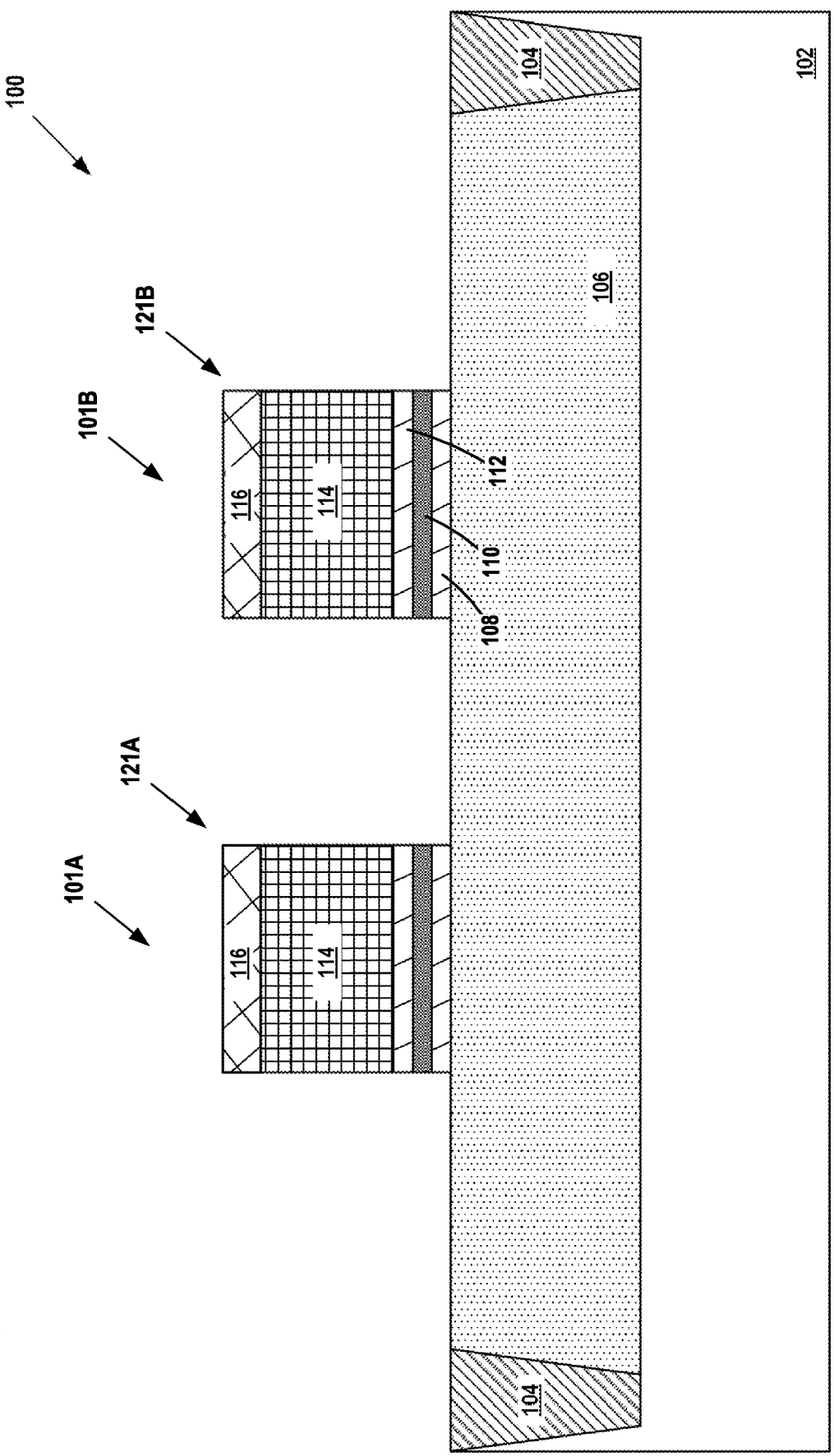

FIG. 3 depicts the IC product 100 after several process operations were performed. First, one or more etching processes were performed through the patterned etch mask 117 to pattern the various layers of material shown in FIG. 3. This process operation results in the formation of a plurality of gate structures 121A, 121B (collectively referenced using the numeral 121) for the memory cells 101A, 101B, respectively. Thereafter, the patterned etch mask 117 was removed. In the example, the capping layer 116 may be referred to as a gate cap since it is positioned above a gate structure.

Figure 4:
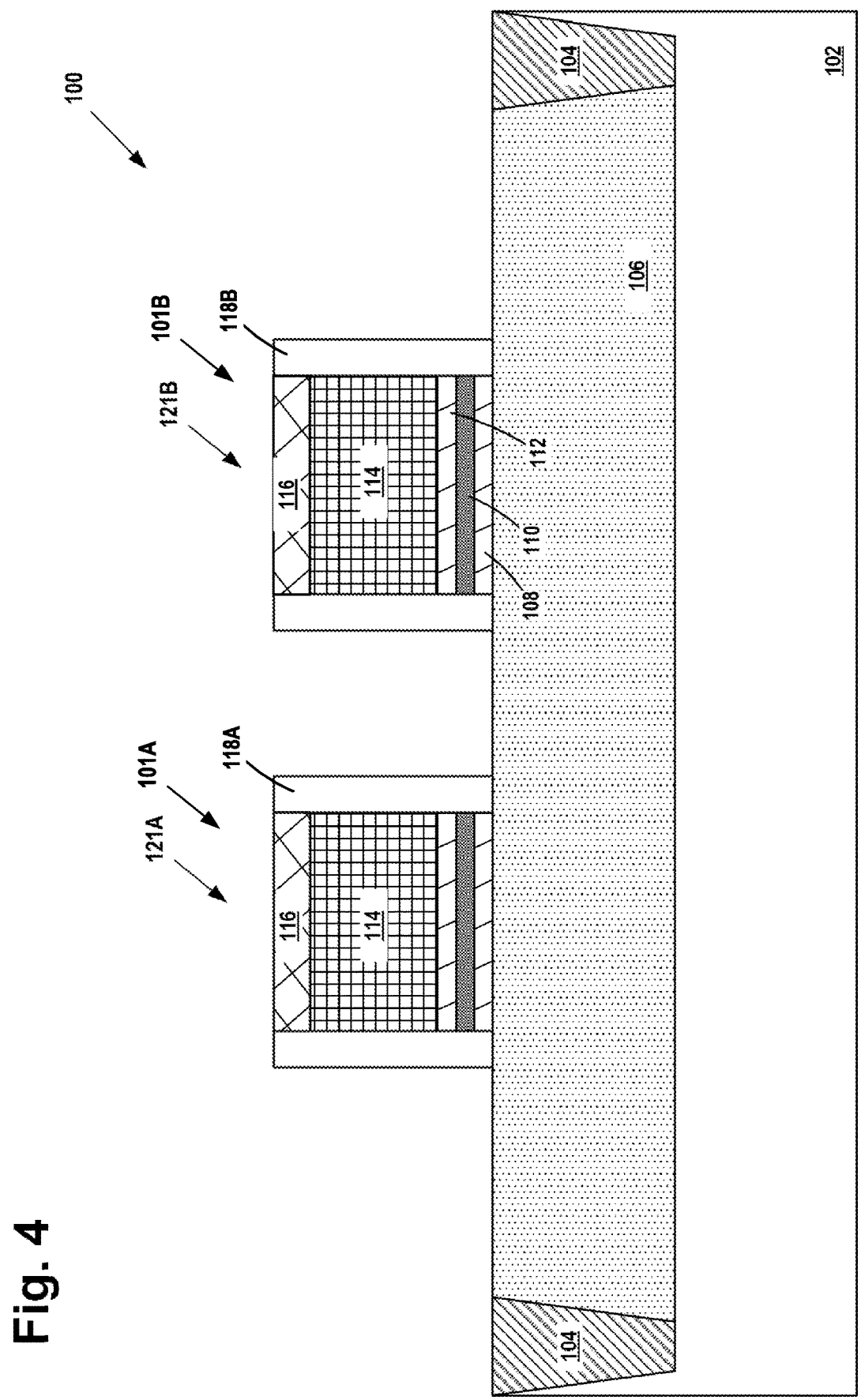

FIG. 4 depicts the IC product 100 after first and second sidewall spacers 118A, 118B (collectively referenced using the numeral 118) were formed adjacent the sidewalls of the gate structures 121A, 121B, respectively. The sidewall spacers 118 may be formed by depositing a conformal layer of spacer material and thereafter performing an anisotropic etching process. The sidewall spacers 118 may be of any desired thickness (at its base) and they may be made of any desired material, e.g., silicon nitride, a low-k material (k values of less than 3.5), etc. In the depicted example, the sidewall spacers 118 are positioned on and in physical contact with the sidewalls of the gate structures 121. In some cases, there may be multiple sidewall spacers formed adjacent the sidewalls of the gate structures 121.

Figure 5:
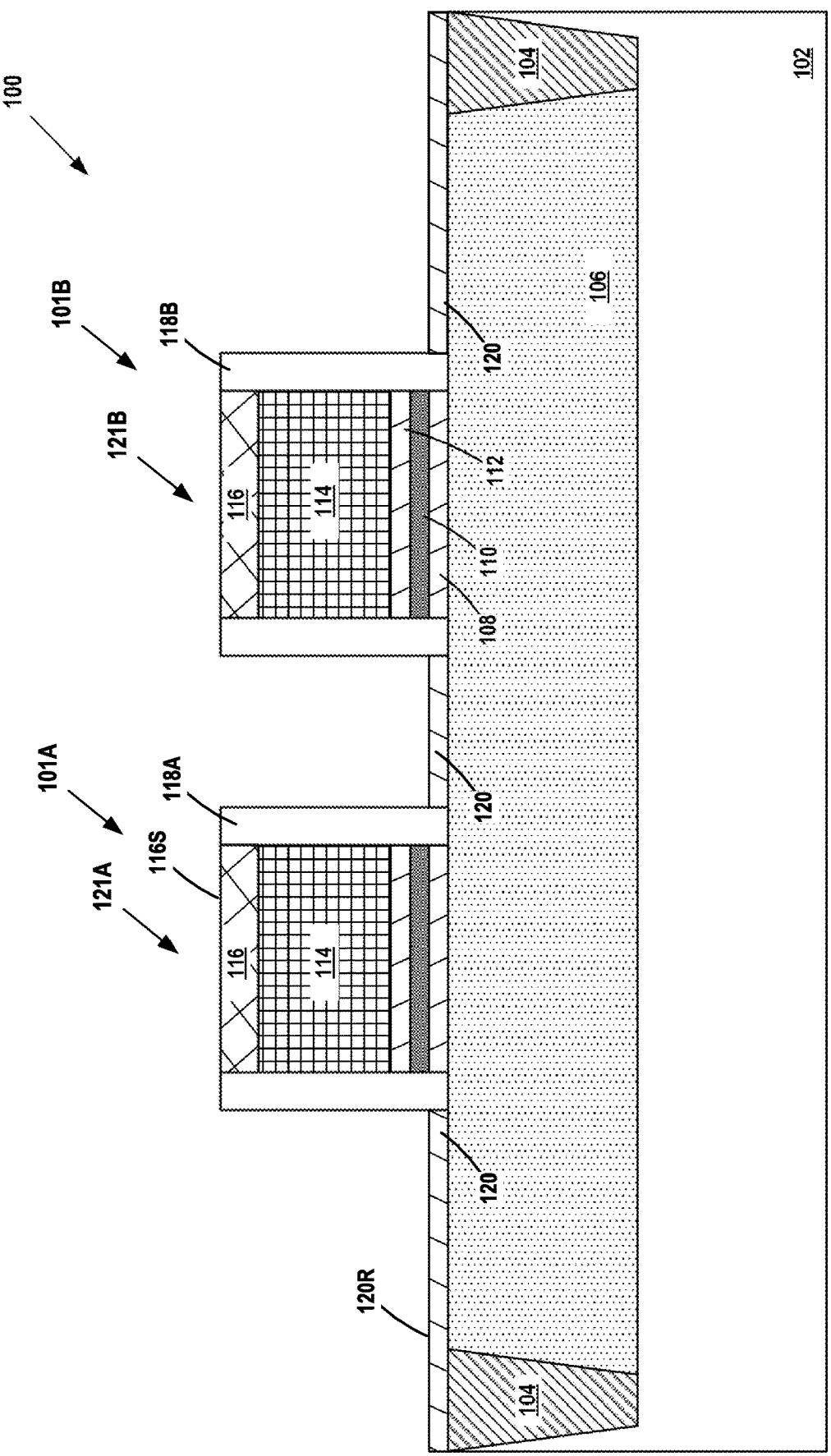

FIG. 5 depicts the IC product 100 after several process operations were performed. First, in one illustrative process flow, a layer of insulating material 120 was deposited in the spaces between the gate structures 121. At that point, a timed, recess etching process was performed to remove a portion of the vertical thickness of the layer of insulating material 120 such that the upper surface 120R on the layer of insulating material is positioned at a desired height level above the upper surface of the substrate 102. The final thickness of the layer of insulating material 120 may vary depending upon the particular application. The layer of insulating material 120 may be comprised of, for example, silicon dioxide, a HARP oxide, HDP oxide, flowable oxide, etc., or a combination of such materials.

Figure 6:
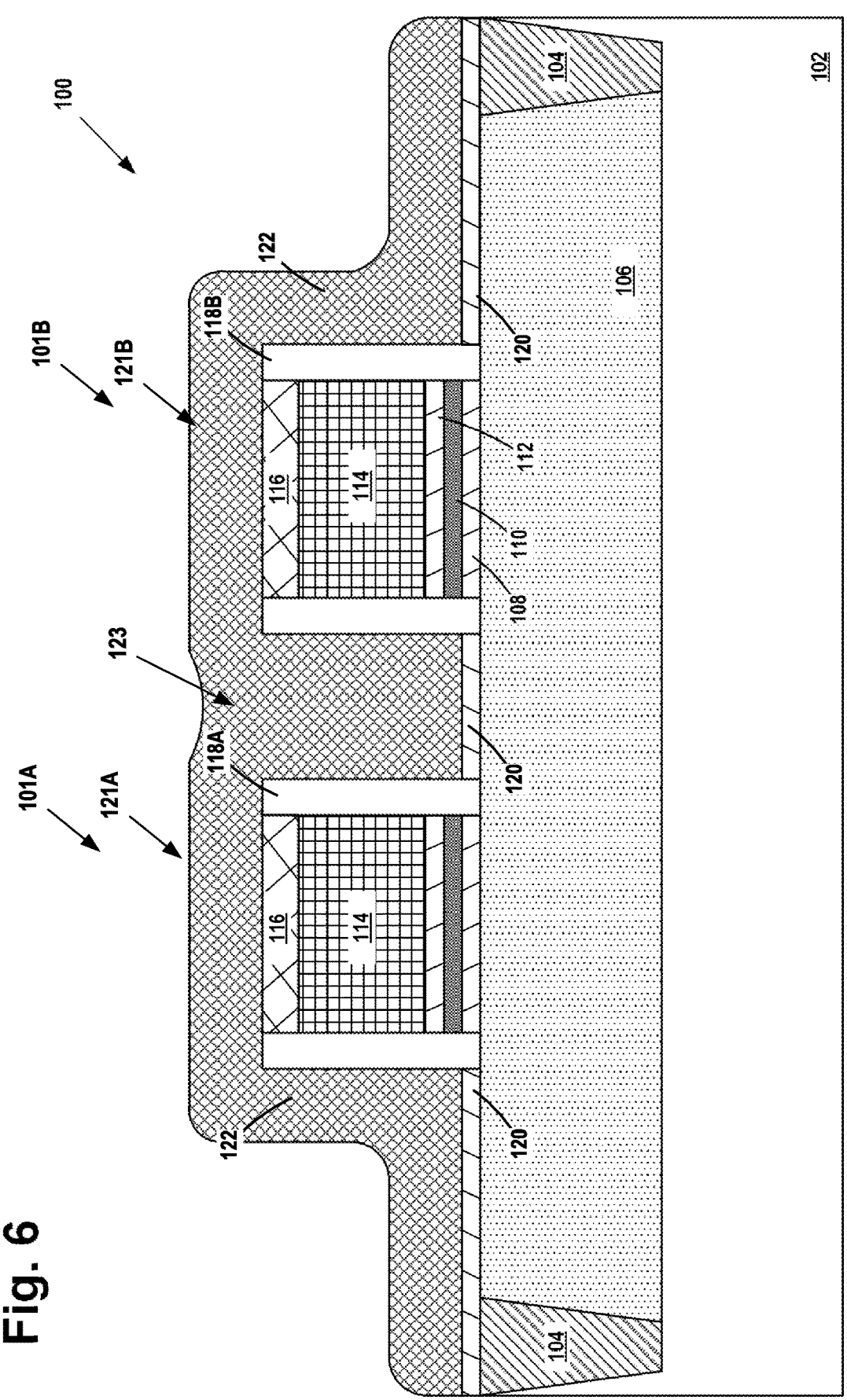

FIG. 6 depicts the IC product 100 after a conformal deposition process was performed to form a conformal layer of conductive material 122 above the substrate 102. The conformal layer of conductive material 122 may be comprised of a variety of different conductive materials, e.g., a doped polysilicon, amorphous polysilicon, etc., and it may be formed to any desired thickness. Note that the conformal layer of conductive material 122 is formed in such a manner that it "pinches off" and substantially overfills the space 123 between the first sidewall spacer 118A and the second sidewall spacer 118B on the adjacent gate structure 121A, 121B, respectively.

Figure 7:
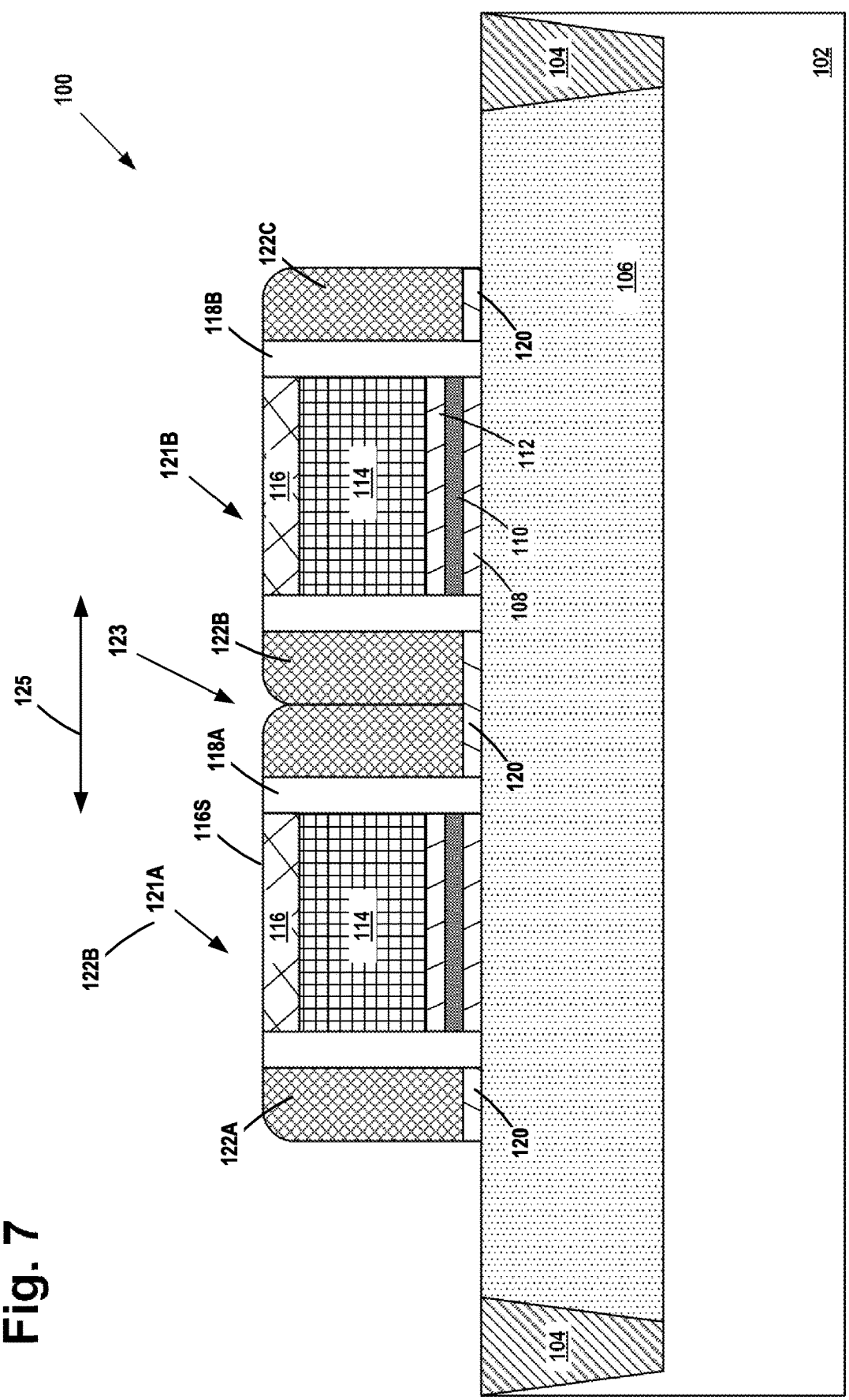

FIG. 7 depicts the IC product 100 after an anisotropic etching process was performed on the conformal layer of conductive material 122. This process operation results in the formation of a first conductive structure 122A positioned on one side of the gate structure 121A adjacent the spacer 118A, a combined or merged second conductive structure 122B positioned in the space 123 between the two gate structures 121 and a third conductive structure 122C positioned on one side of the gate structure 121B adjacent the spacer 118B. The combined conductive structure 122B is positioned between the first and second sidewall spacers 118A and 118B. In one particular example, the first conductive structure 122A is positioned on and in physical contact with the first sidewall spacer 118A, the combined or merged second conductive structure 122B is positioned on and in physical contact with both the first sidewall spacer 118A and the second sidewall spacer 118B and the third conductive structure 122C is positioned on and in physical contact with the second sidewall spacer 118B. The conductive structures 122A, 122B and 122C may have any desired lateral thickness (as measured at their base in the direction indicated by the double arrowed line 125). After the formation of the conductive structures 122A, 122B and 122C, an etching process was performed to remove the exposed portions of the recessed layer of insulating material 120. Note that the insulating material 120 still remains positioned between the bottom surfaces of the conductive structures 122A, 122B and 122C and the upper surface of the substrate 102. Also note that, in this particular example, the upper surfaces of the conductive structures 122A, 122B and 122C are positioned at a level that is substantially co-planar with or slightly below the upper surfaces 116S of the gate caps 116.

Figure 8:
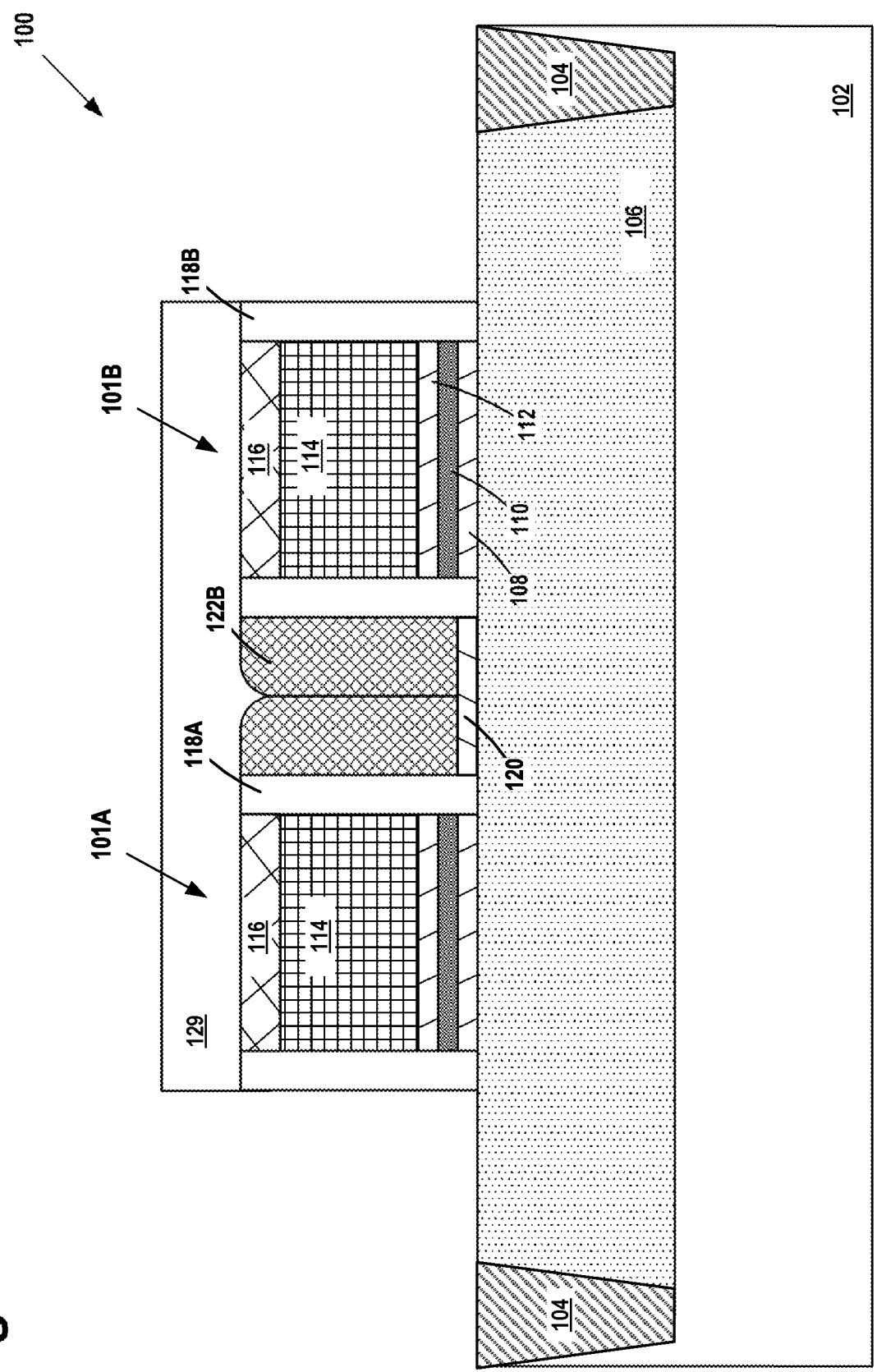

FIG. 8 depicts the IC product 100 after several process operations were performed. First, a patterned etch mask 129 was formed on the IC product 100. In one illustrative example, the patterned etch mask 129 may be a patterned layer of photoresist or OPL, and it may be formed by performing known manufacturing techniques. The patterned etch mask 129 exposes the conductive structures 122A and 122C. Thereafter, an etching process was performed to remove the conductive structures 122A and 122C. Another etching process was then performed to remove the portions of the recessed layer of insulating material 120 exposed by the removal of the conductive structures 122A and 122C.

Figure 9:
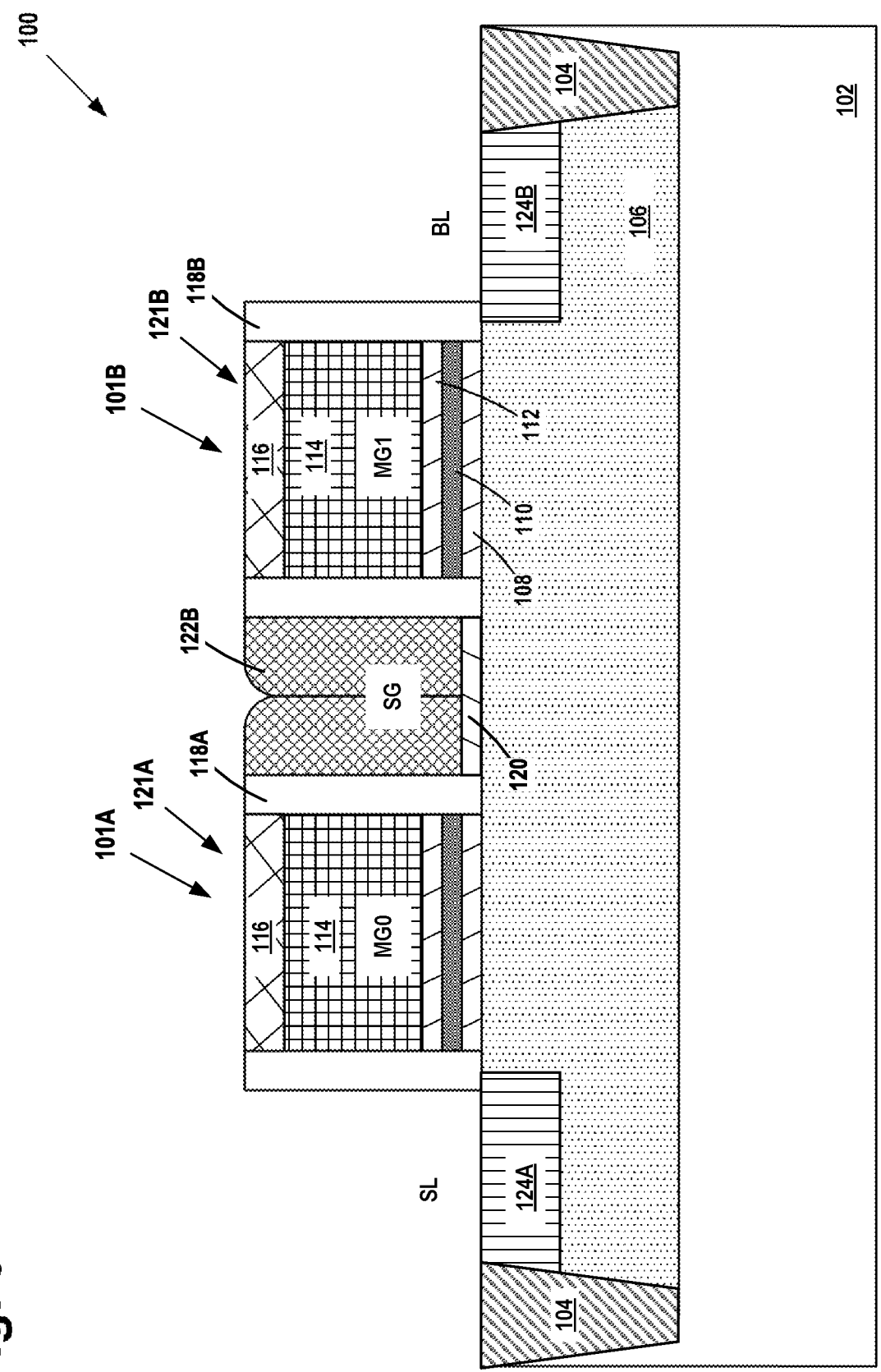

FIG. 9 depicts the IC product 100 after several process operations were performed. First, the patterned etch mask 129 was removed. Thereafter, an ion implantation process was performed to form N-type implant regions 124A, 124B (collectively referenced using the numeral 124) in the substrate 102. The concentration of dopant atoms in the implant regions 124 may vary depending upon the particular application. Note that, in this embodiment, a portion of the implant region 124A extends under the first sidewall spacer 118A and a portion of the implant region 124B extends under the second sidewall spacer 118B.

FIG. 9 depicts the two memory cells 101A, 101B (e.g., a dual-bit memory cell). The memory cell 101A comprises a memory gate (MG0) and the memory cell 101B comprises a memory gate (MG1). In this illustrative embodiment, the combined, merged conductive structure 122B functions as a shared select gate (SG) for both of the memory cells 101. The doped regions 124A, 124B function as, respectively, a source line (SL) and a bit line (BL) for both of the memory cells 101. The dual-bit memory cell may be erased by Fowler-Nordheim (F-N) tunneling or hot-hole injection, and each of the individual memory cells 101A, 101B may be programmed separately by source side injection.

Figure 11:
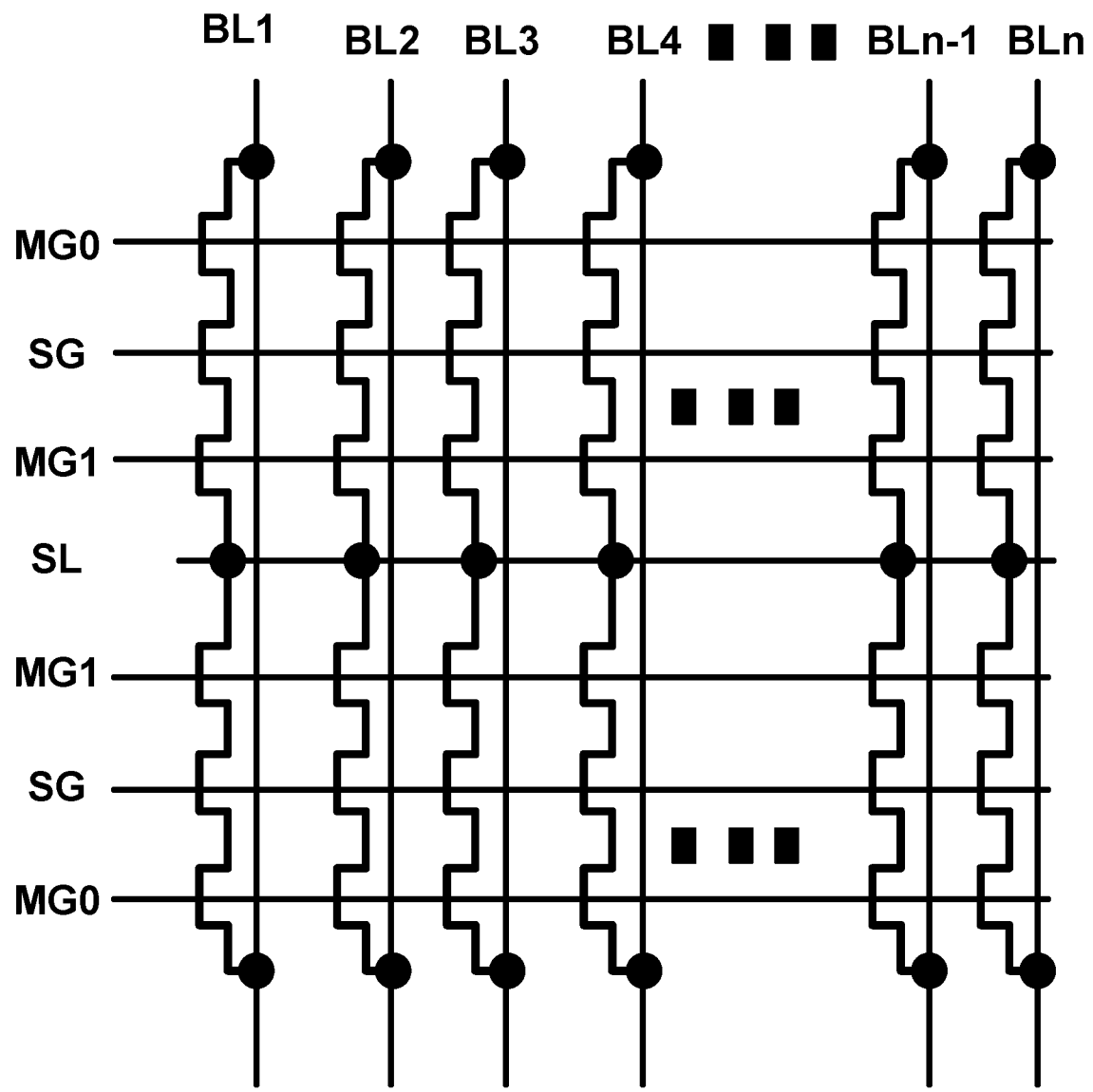
Figure 12:
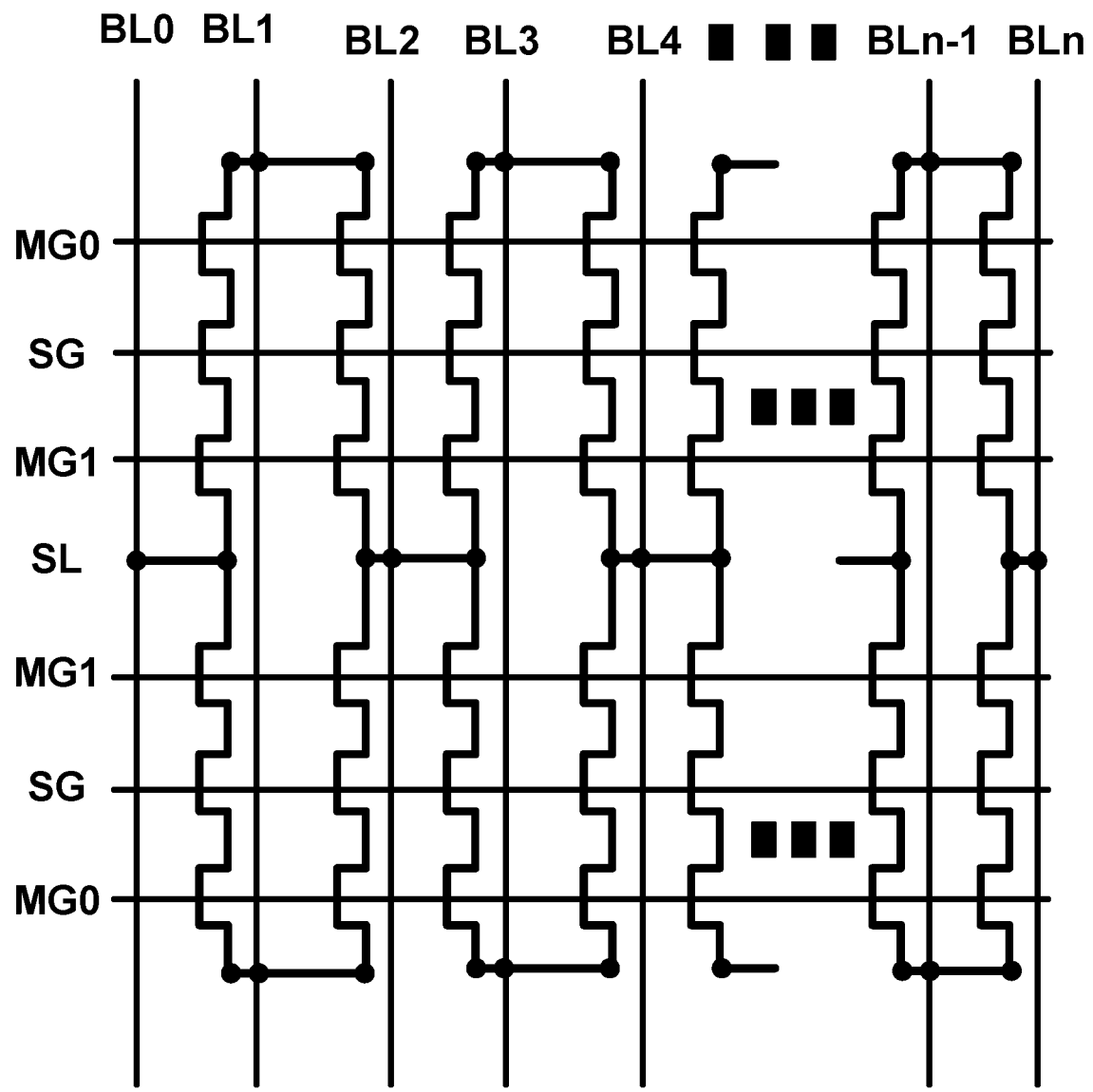

FIG. 10 depicts a bias table for the dual bit memory cell shown in FIG. 9. As will be appreciated by those skilled in the art after a complete reading of the present application, the novel dual bit memory cell disclosed herein may be arranged in an array having a variety of different configurations. For example, FIG. 11 depicts one possible configuration of a memory array wherein all of the dual bit memory cells share a common or local source line. FIG. 12 depicts yet another possible configuration of a memory array wherein the source line and the bit line are shared locally between alternating dual bit memory cells.

As will be appreciated by those skilled in the art after a complete reading of the present application, the novel, dual bit memory cell disclosed herein is significantly more compact as compared to other memory cells due to the formation of the combined conductive structure 122B that functions as a shared select gate (SG) for both of the two memory cells 101A, 101B. For example, for a standard prior art 55 nm SONOS memory cell, the cell size is approximately 0.128 $\mu m^2$ or about 42.2 $F^2$. In contrast, the novel arrangement of the compact memory cells 101 shown in FIG. 9 has a cell size of approximately 0.07 µm² or about 23.1 F², which is about 45% less than the cell size of the prior art SONOS cell. At the point of processing depicted in FIG. 9, traditional manufacturing operations may be performed to complete the fabrication of the IC product 100.

Figure 13:
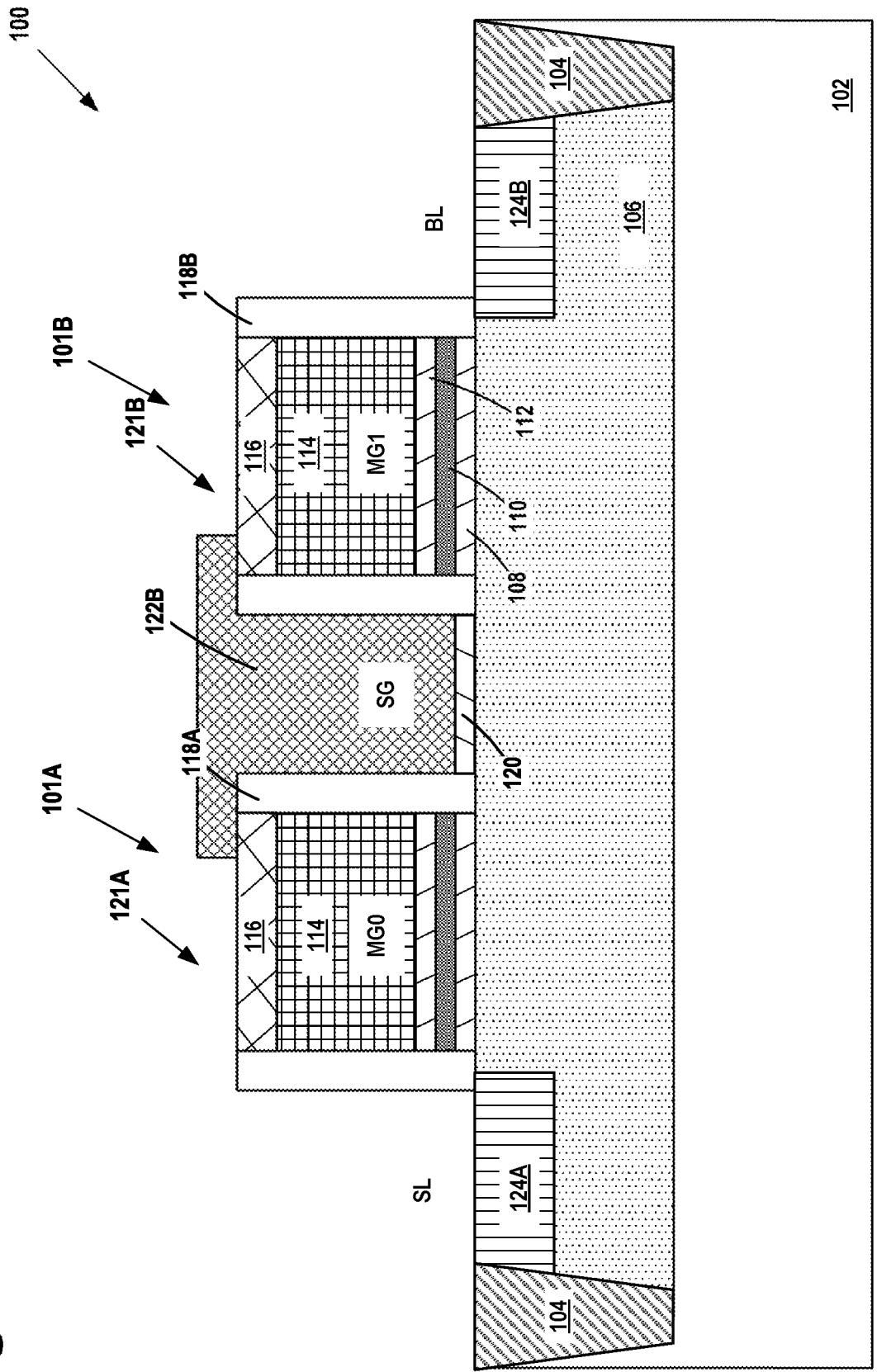

As will be appreciated by those skilled in the art after a complete reading of the present application, the novel, dual bit memory cell disclosed herein may come in a variety of configurations where the conductive structure 122B is a select gate (SG) that is shared by both of the memory cells 101A and 101B. For example, FIG. 13 depicts an embodiment wherein the conductive material for the conductive structures 122 is deposited and patterned in such a manner that the upper surface of the second conductive structure 122B (i.e., the shared select gate) is positioned at a level that is above the level of the upper surface of the gate caps 116. In this example, a first portion of the second conductive structure 122B is positioned vertically above a portion of the gate structure 121A of the memory cell 101A, while a second portion of the second conductive structure 122B is positioned vertically above a portion of the gate structure 121B of the memory cell 101B.

Figure 14:
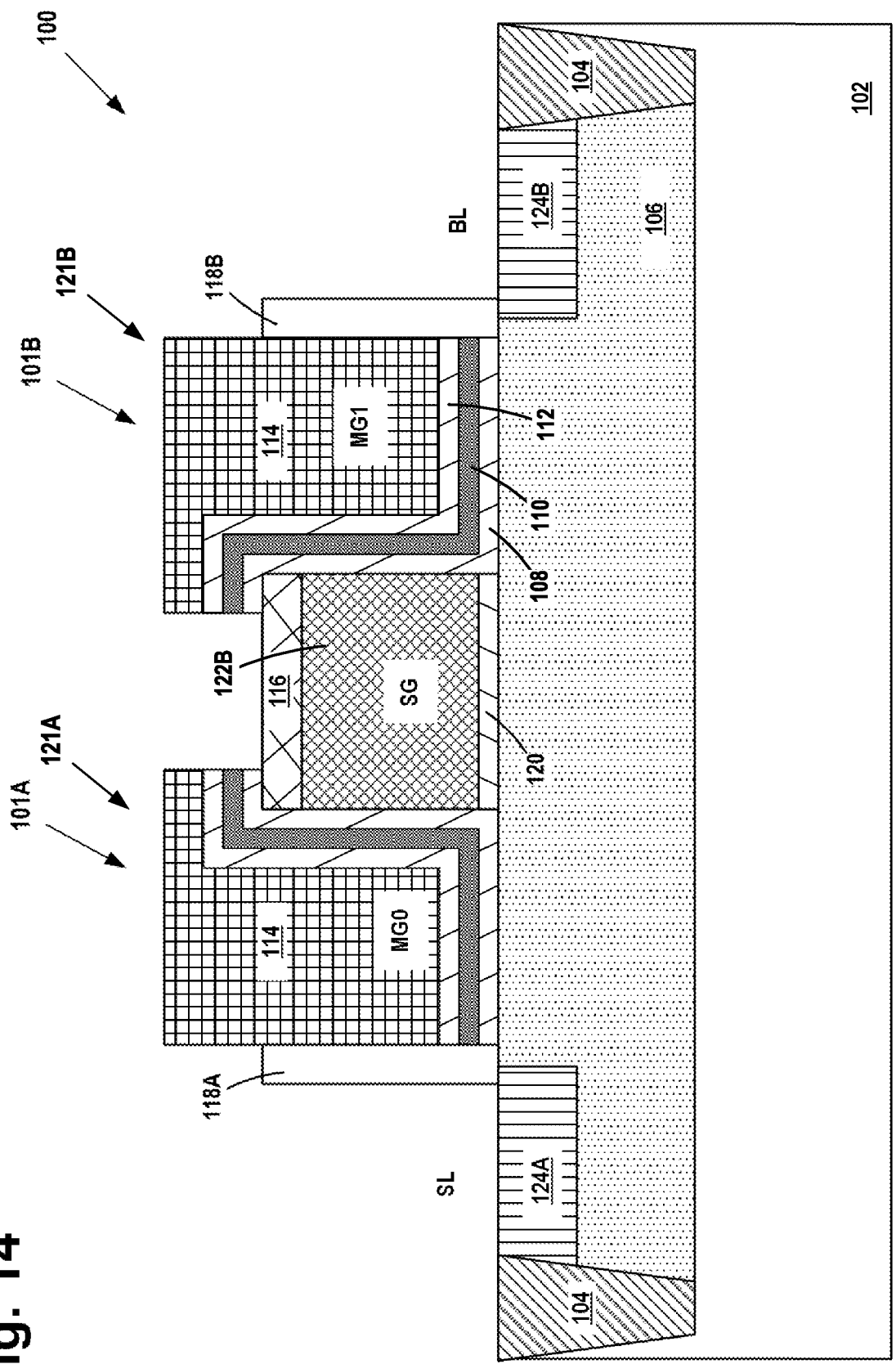

In the embodiment shown in FIG. 14, the cap layer 116 is positioned above the conductive structure 122B, i.e., the shared select gate (SG). This structure may be achieved by sequentially depositing the materials for the insulation layer 120, the conductive structures 122 and the capping layer 116 on the product and thereafter patterning those materials by performing known masking and etching techniques. Thereafter, the gate structure 121A for the memory cell 101A was formed between the first conductive structure 122A and the second conductive structure 122B, and the gate structure 121B for the memory cell 101B was formed between the second conductive structure 122B and the third conductive structure 122C. In one illustrative process flow, the materials for the gate insulation layer 108, the charge storage layer 110 and the blocking insulation layer 112 were formed by performing conformal deposition processes. Thereafter, the gate electrode material 114 was deposited so as to over-fill the remaining spaces between the conductive structures 122. At that point, the materials for the gate structures were patterned by performing known masking and etching techniques. Thereafter, the first conductive structure 122A and the third conductive structure 122C were removed. Note that the uppermost surface of the gate structures 121 is positioned at a level that is above the level of the upper surface of the conductive structure 122B. In this example, a portion of the gate structure 121A of the memory cell 101A is positioned vertically above a portion of the second conductive structure 122B and a portion of the gate structure 121B of the memory cell 101B is positioned vertically above the second conductive structure 122B. Also note that, in this embodiment, the gate structure 121A of the memory cell 101A, and particularly the gate insulation layer 108, is positioned on and in physical contact with the conductive structure 122B (i.e., the shared select gate (SG)), while the gate structure 121B of the memory cell 101B, and particularly the gate insulation layer 108, is positioned on and in physical contact with the conductive structure 122B.

Figure 15:
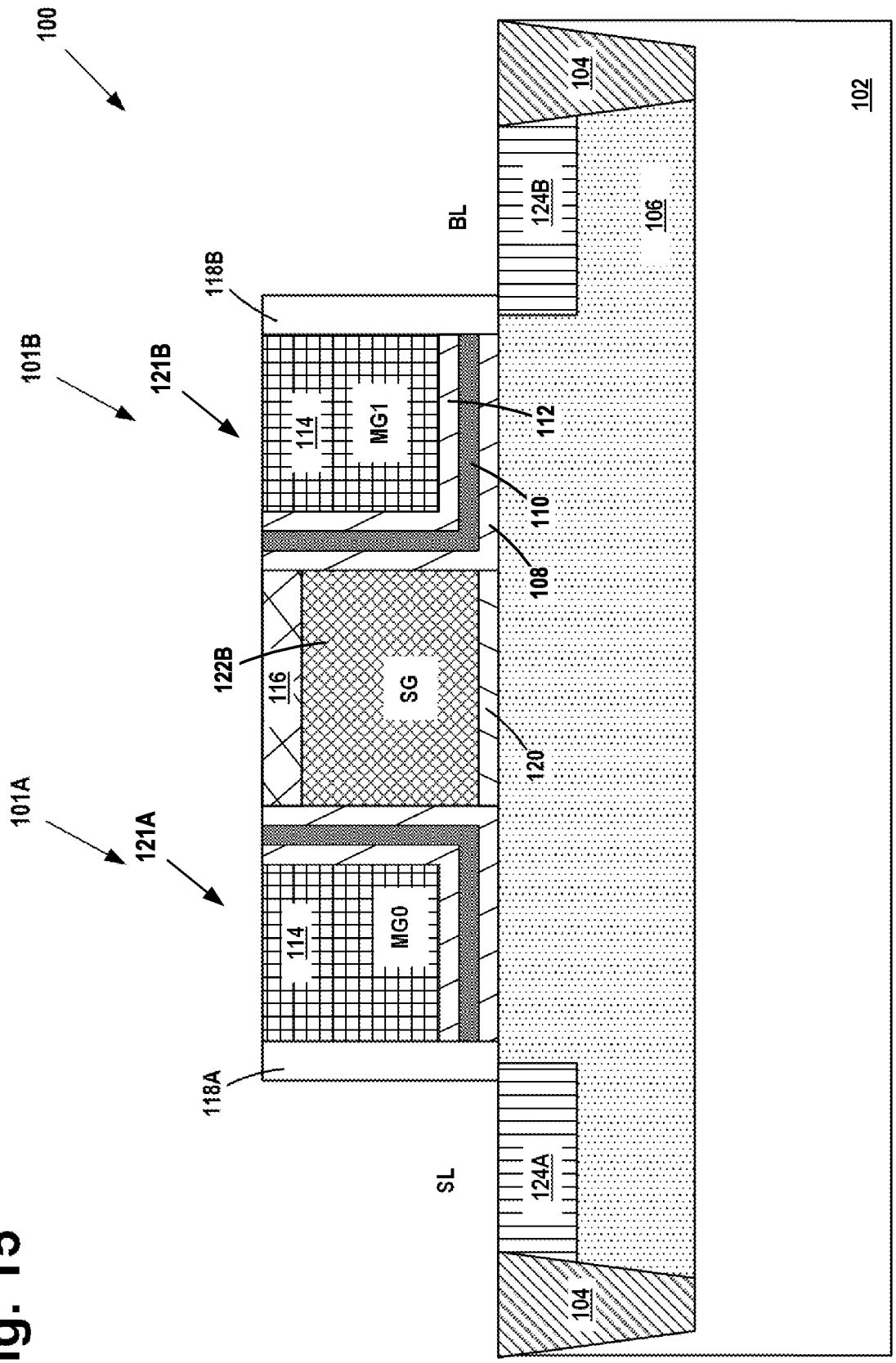

FIG. 15 depicts an embodiment that is similar to the embodiment shown in FIG. 14, in that the capping material 116 is positioned above the conductive structure 122B and that the materials for the gate insulation layer 108, the charge storage layer 110 and the blocking insulation layer 112 were formed by performing conformal deposition processes. In this embodiment, after depositing the gate electrode material 114, a CMP process operation was performed to remove all materials above the upper surface of the cap layer 116. As a result, the upper surface of the gate structures is substantially co-planar with the upper surface of the cap layer 116. Also note that, in this embodiment, the gate structure 121A of the memory cell 101A, and particularly the gate insulation layer 108, is positioned on and in physical contact with the conductive structure 122B, while the gate structure 121B of the memory cell 101B, and particularly the gate insulation layer 108, is positioned on and in physical contact with the conductive structure 122B.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A device, comprising:
   a semiconductor substrate having an upper surface;
   a first memory cell comprising a first memory gate positioned above the upper surface of the semiconductor substrate;
   a second memory cell comprising a second memory gate positioned above the upper surface of the semiconductor substrate; and
   a conductive select gate structure positioned above and in adjoining physical contact with an insulating layer, wherein the insulating layer is above the upper surface of the semiconductor substrate between the first and second memory gates, wherein the conductive select gate structure is shared by the first and second memory cells, and wherein the conductive select gate structure extends from an upper surface of the first memory gate and an upper surface of the second memory gate to the insulating layer.

2. The device of claim 1, further comprising:
   a first sidewall spacer positioned adjacent the first memory gate; and
   a second sidewall spacer positioned adjacent the second memory gate, wherein the conductive select gate structure physically contacts both the first and second sidewall spacers.

3. The device of claim 1, further comprising:
   a first doped region in the semiconductor substrate, wherein the first doped region functions as a source line for the first and second memory cells; and
   a second doped region in the semiconductor substrate, wherein the second doped region functions as a bit line for the first and second memory cells.

4. The device of claim 1, further comprising:
   a layer of insulating material positioned between a bottom surface of the conductive select gate structure and the upper surface of the semiconductor substrate;

a first gate cap positioned above the first memory gate, the first gate cap having an upper surface; and
a second gate cap positioned above the second memory gate, the second gate cap having an upper surface, wherein an upper surface of the conductive select gate structure is positioned below or substantially coplanar with the upper surfaces of the first and second gate caps.

5. The device of claim 1, further comprising:
a layer of insulating material positioned between a bottom surface of the conductive select gate structure and the upper surface of the semiconductor substrate;
a first gate cap positioned above the first memory gate, the first gate cap having an upper surface; and
a second gate cap positioned above the second memory gate, the second gate cap having an upper surface, wherein an upper surface of the conductive select gate structure is positioned above the upper surfaces of the first and second gate caps.

6. The device of claim 1, wherein each of the first and second memory gates comprise:
a gate insulation layer positioned above the semiconductor substrate;
a charge storage layer positioned above the gate insulation layer;
a blocking insulation layer positioned above the charge storage layer; and
a conductive gate electrode positioned above the blocking insulation layer.

7. The device of claim 1, further comprising:
a first sidewall spacer positioned adjacent the first memory gate, wherein the first sidewall spacer physically contacts the first memory gate; and
a second sidewall spacer positioned adjacent the second memory gate, wherein the second sidewall spacer physically contacts the second memory gate.

8. The device of claim 1, wherein the conductive select gate structure physically contacts the first memory gate and physically contacts the second memory gate.

9. A device, comprising:
a semiconductor substrate having an upper surface;
a first memory cell comprising a first memory gate positioned above the upper surface of the semiconductor substrate;
a first sidewall spacer positioned adjacent the first memory gate, wherein the first sidewall spacer extends from an upper surface of the first memory gate to the upper surface of the semiconductor substrate;
a second memory cell comprising a second memory gate positioned above the upper surface of the semiconductor substrate;
a second sidewall spacer positioned adjacent the second memory gate, wherein the second sidewall spacer extends from an upper surface of the second memory gate to the upper surface of the semiconductor substrate; and
a conductive select gate structure positioned above the upper surface of the semiconductor substrate between the first and second sidewall spacers, wherein the conductive select gate structure is shared by the first and second memory cells.

10. The device of claim 9, further comprising:
a first doped region in the semiconductor substrate, wherein the first doped region functions as a source line for the first and second memory cells; and
a second doped region in the semiconductor substrate, wherein the second doped region functions as a bit line for the first and second memory cells.

11. The device of claim 10, wherein the conductive select gate structure physically contacts both the first sidewall spacer and the second sidewall spacer.

12. The device of claim 9, further comprising:
a first gate cap positioned above the first memory gate, the first gate cap having an upper surface; and
a second gate cap positioned above the second memory gate, the second gate cap having an upper surface, wherein an upper surface of the conductive select gate structure is positioned below or substantially coplanar with the upper surfaces of the first and second gate caps.

13. The device of claim 9, further comprising:
a first gate cap positioned above the first memory gate, the first gate cap having an upper surface; and
a second gate cap positioned above the second memory gate, the second gate cap having an upper surface, wherein an upper surface of the conductive select gate structure is positioned above the upper surfaces of the first and second gate caps.

14. The device of claim 9, wherein the first sidewall spacer physically contacts the first memory gate and wherein the second sidewall spacer physically contacts the second memory gate.

15. The device of claim 9, further comprising a layer of insulating material positioned between a bottom surface of the conductive select gate structure and the upper surface of the semiconductor substrate.

16. A device, comprising:
a semiconductor substrate having an upper surface;
a first memory cell comprising a first memory gate positioned above the upper surface of the semiconductor substrate;
a second memory cell comprising a second memory gate positioned above the upper surface of the semiconductor substrate;
a conductive select gate structure positioned above the upper surface of the semiconductor substrate, wherein the conductive select gate structure is shared by the first and second memory cells and wherein the conductive select gate structure physically contacts the first memory gate and physically contacts the second memory gate;
a first sidewall spacer adjacent the first memory gate and opposite the conductive select gate structure;
a second sidewall spacer adjacent the second memory gate and opposite the conductive select gate structure;
a first doped region in the semiconductor substrate, wherein a portion of the first doped region is under the first sidewall spacer; and
a second doped region in the semiconductor substrate, wherein a portion of the second doped region is under the second sidewall spacer.

17. The device of claim 16:
wherein the first doped region functions as a source line for the first and second memory cells; and
wherein the second doped region functions as a bit line for the first and second memory cells.

18. The device of claim 16, further comprising:
a layer of insulating material positioned between a bottom surface of the conductive select gate structure and the upper surface of the semiconductor substrate; and
a first cap layer positioned above the conductive select gate structure, the first cap layer having an upper surface, wherein an upper surface of the first memory gate and an upper surface of the second memory gate are positioned at a level that is above a level of the upper surface of the first cap layer.

19. The device of claim 16, further comprising:
a layer of insulating material positioned between a bottom surface of the conductive select gate structure and the upper surface of the semiconductor substrate; and
a first cap layer positioned above the conductive select gate structure, the first cap layer having an upper surface, wherein an upper surface of the first memory gate and an upper surface of the second memory gate are positioned at a level that is below a level of the upper surface of the first cap layer.

20. The device of claim 16, wherein the first memory gate comprises a first gate insulation layer, the second memory gate comprises a second gate insulation layer and wherein the conductive select gate structure physically contacts the first gate insulation layer and physically contacts the second gate insulation layer.

* * * * *